United States Patent
He

(10) Patent No.: US 12,451,373 B2
(45) Date of Patent: Oct. 21, 2025

(54) MOLDING DEVICE FOR CURVED DISPLAY PANEL, MOLDING METHOD THEREOF, AND CURVED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Ping He, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/611,565

(22) PCT Filed: Sep. 24, 2021

(86) PCT No.: PCT/CN2021/120330
§ 371 (c)(1),
(2) Date: Mar. 16, 2023

(87) PCT Pub. No.: WO2023/035337
PCT Pub. Date: Mar. 16, 2023

(65) Prior Publication Data
US 2024/0047240 A1 Feb. 8, 2024

(30) Foreign Application Priority Data

Sep. 10, 2021 (CN) .......................... 202111060509.1

(51) Int. Cl.
*H01L 21/67* (2006.01)
*B29C 33/30* (2006.01)
(Continued)

(52) U.S. Cl.
CPC ...... *H01L 21/67092* (2013.01); *B29C 33/308* (2013.01); *B29C 53/04* (2013.01);
(Continued)

(58) Field of Classification Search
CPC .......... C03B 23/023–037; B29C 53/04; B29C 33/308; B29C 33/302; H01L 21/67092
See application file for complete search history.

(56) References Cited

U.S. PATENT DOCUMENTS 5,470,590 A * 11/1995 Brubaker ............. A47C 23/002
264/222
2004/0245428 A1* 12/2004 Moshe .................. B29C 45/376
249/102

(Continued)

FOREIGN PATENT DOCUMENTS

CN 2848532 Y 12/2006
CN 2015039862 A 3/2015
(Continued)

OTHER PUBLICATIONS

Notification to Grant Patent Right for Invention issued in corresponding Chinese Patent Application No. 202111060509.1 dated Jun. 27, 2022, pp. 1-4.

(Continued)

*Primary Examiner* — Susan D Leong
*Assistant Examiner* — Vipul Malik
(74) *Attorney, Agent, or Firm* — PV IP PC; Wei Te Chung

(57) ABSTRACT

The present disclosure provides a molding device for a curved display panel, the molding device includes a mapping structure with a plurality of thimble pins and a jacking mechanism, one end of each of the thimble pins is configured to be attached to a display panel, the jacking mechanism includes a plurality of bottom plate and a plurality of (Continued)

driving members, each of the bottom plates is configured to be attached to another end of corresponding thimble pins, any one of the bottom plates is independently driven by one of the driving members, the plurality of bottom plates can separately drive the plurality of thimble pins to drive corresponding areas of the display panel to rise by different displacements and achieve a better molding effect.

9 Claims, 8 Drawing Sheets

(51) Int. Cl.
  *B29C 53/04* (2006.01)
  *B29L 31/34* (2006.01)
  *H01L 25/16* (2023.01)
  *H10K 59/80* (2023.01)
(52) U.S. Cl.
  CPC ..... *B29L 2031/3475* (2013.01); *H01L 25/167* (2013.01); *H10K 59/80* (2023.02)

(56) References Cited

U.S. PATENT DOCUMENTS

| | | | | |
|---|---|---|---|---|
| 2015/0084237 | A1* | 3/2015 | Siagam | B29C 67/0011 425/383 |
| 2020/0037442 | A1 | 1/2020 | Keum et al. | |
| 2020/0062632 | A1* | 2/2020 | Brennan | C03B 23/0307 |

FOREIGN PATENT DOCUMENTS

| | | | | |
|---|---|---|---|---|
| CN | 104483774 | A | | 4/2015 |
| CN | 104914609 | A | | 9/2015 |
| CN | 106707569 | A | | 5/2017 |
| CN | 106970491 | A | | 7/2017 |
| CN | 107016936 | A | | 8/2017 |
| CN | 108128490 | A | | 6/2018 |
| CN | 207578913 | U | | 7/2018 |
| CN | 108803124 | A | | 11/2018 |
| CN | 208728463 | U | | 4/2019 |
| CN | 211968471 | U | | 11/2020 |
| CN | 212285572 | U | | 1/2021 |
| CN | 213004854 | U | | 4/2021 |
| CN | 112912350 | A | | 6/2021 |
| CN | 112937059 | A | * | 6/2021 ........... B32B 37/003 |
| CN | 213972377 | U | | 8/2021 |
| CN | 113370633 | A | | 9/2021 |
| JP | 2015039862 | A | * | 3/2015 |
| JP | 6528701 | B2 | * | 6/2019 |
| KR | 20170087362 | A | | 7/2017 |
| WO | 2020080305 | A1 | | 4/2020 |

OTHER PUBLICATIONS

Chinese Office Action issued in corresponding Chinese Patent Application No. 202111060509.1 dated Apr. 6, 2022, pp. 1-9.
International Search Report in International application No. PCT/CN2021/120330, mailed on Feb. 25, 2022.
Written Opinion of the International Searching Authority in International application No. PCT/CN2021/120330, 4 mailed on Feb. 25, 2022.

* cited by examiner

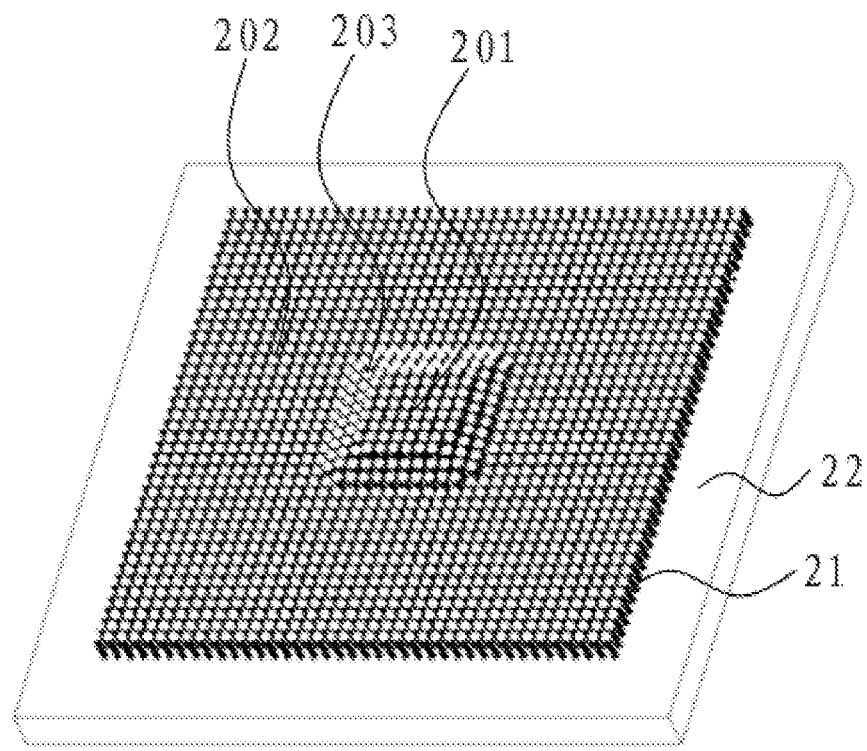
FIG. 10
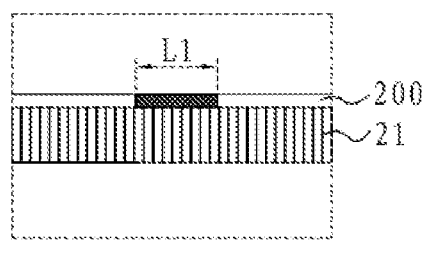 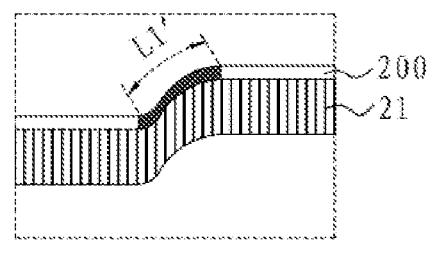
a b
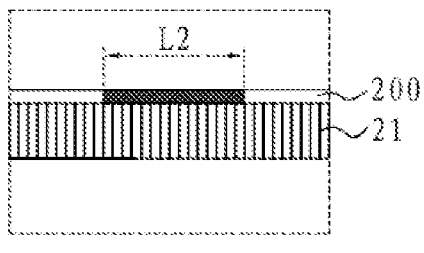 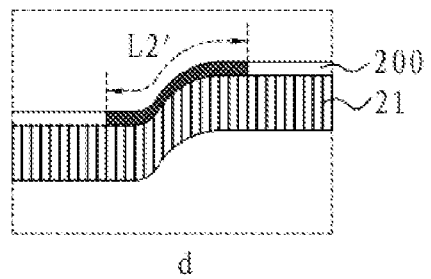
c d
FIG. 11

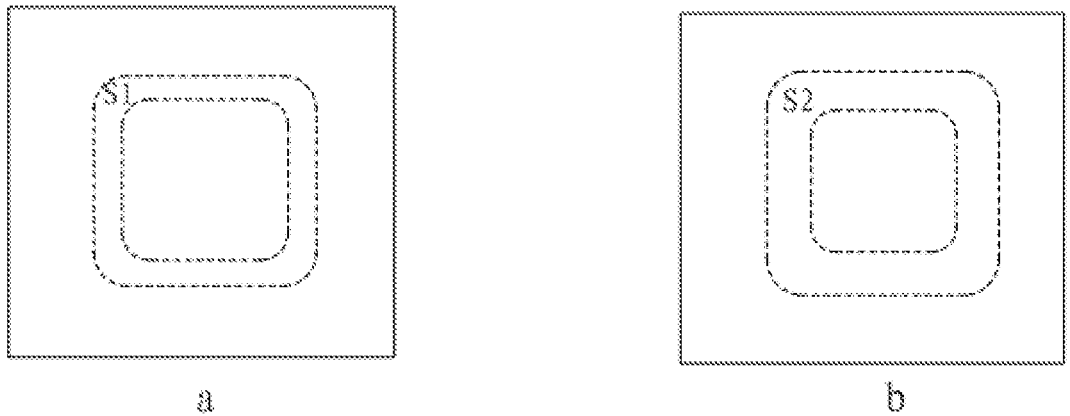

FIG. 12

| Providing a molding device for the curved display panel, wherein the molding device includes a mapping structure and a jacking mechanism; wherein the mapping structure includes a plurality of thimble pins movable in a vertical direction, the jacking mechanism includes a bottom plate assembly and a plurality of driving members; the bottom plate assembly includes a plurality of bottom plates, and any one of the bottom plates is independently driven by one of the driving members | S10 |

↓

| Attaching one end of the plurality of thimble pins of the mapping structure to the display panel, and attaching another end of the plurality of thimble pins of the mapping structure to the plurality of bottom plates | S20 |

↓

| Driving the plurality of driving members to move the thimble pins corresponding to the plurality of driving members in the vertical direction | S30 |

FIG. 13

MOLDING DEVICE FOR CURVED DISPLAY PANEL, MOLDING METHOD THEREOF, AND CURVED DISPLAY PANEL

TECHNICAL FIELD

The present disclosure relates to a field of curved display technology, and more particularly to a molding device for a curved display panel, a molding method thereof, and a curved display panel.

BACKGROUND

Existing full-screen mobile phones cannot achieve a real 100% full screen, but a four-curved surfaces mobile phone with a lifting type or under-screen camera can visually achieve a true full screen. However, it is quite difficult for a flexible display module to realize four-curved surfaces. When 3D attaching is performed on the flexible display module, there are redundant parts in four corners, which may lead to attaching wrinkles and affect a display effect. In addition, a current conventional attaching method is to attach a display module to a bearing film, and then perform four-curved surfaces molding using methods such as vacuum adsorption or mold pressing. These methods have problems such as uncontrollable molding methods and damage to the display module during compression molding, and an effect of attaching four-curved surfaces as required is difficult to achieve.

SUMMARY

The present disclosure provides a molding device for a curved display panel, a molding method thereof, and a curved display panel, so as to solve technical problems that existing molding methods of curved display panel have uncontrollable risks and cause damage to a display panel.

In order to solve the above problems, technical solutions provided by the present disclosure are as follows:

The present disclosure provides a molding device for a curved display panel, including:

A mapping structure, wherein the mapping structure includes a plurality of thimble pins movable in a vertical direction, one end of each of the thimble pins is configured to be attached to a display panel.

A jacking mechanism, wherein the jacking mechanism includes a bottom plate assembly and a plurality of driving members.

Wherein, the bottom plate assembly includes a plurality of bottom plates, the display panel includes a planar display area and a curved display area, the planar display area and the curved display area correspond to different bottom plates, each of the bottom plates are configured to be attached to another end of corresponding thimble pins, and any one of the bottom plates is independently driven by one of the driving members.

In some embodiments of the present disclosure, the mapping structure includes a first planar mapping area, a second planar mapping area, and a curved surface mapping area disposed between the first planar mapping area and the second planar mapping area; a distance between the thimble pins of the first planar mapping area and a distance between the thimble pins of the second planar mapping area are greater than a distance between the thimble pins of the curved surface mapping area.

In some embodiments of the present disclosure, the bottom plate assembly includes a first bottom plate and a plurality of second bottom plates, the first bottom plate is configured to be attached to a plurality of the thimble pins of the first planar mapping area; the curved surface mapping area includes a plurality of sub-curved surface mapping areas, each of the second bottom plates is configured to be correspondingly attached to a plurality of the thimble pins of one of the sub-curved surface mapping areas.

In some embodiments of the present disclosure, the plurality of sub-curved surface mapping areas of the curved surface mapping area sequentially surround the first planar mapping area, the plurality of second bottom plates sequentially surround the first bottom plate.

In some embodiments of the present disclosure, each of the thimble pins includes a thimble pin body, a soft cushion disposed at one end of the thimble pin body, and a lubricating layer disposed at another end of the thimble pin body, the soft cushion is configured to be attached to the display panel, and the lubricating layer is configured to be attached to a corresponding bottom plate.

In some embodiments of the present disclosure, an elastic modulus of the soft cushion is 1 Gpa to 1.4 Gpa.

In some embodiments of the present disclosure, a surface friction coefficient of the lubricating layer is 0.02 to 0.10.

In some embodiments of the present disclosure, surface energy of the soft cushion of each of the thimble pins of the curved surface mapping area is smaller than surface energy of the soft cushion of each of the thimble pins of the first planar mapping area.

In some embodiments of the present disclosure, the mapping structure is attached to the display panel through an adhesive layer; the soft cushion of each of the thimble pins of the curved surface mapping area is not attached to the adhesive layer, and the soft cushion of each of the thimble pins of the first planar mapping area is attached to the adhesive layer.

In some embodiments of the present disclosure, the soft cushion of each of the thimble pins of the curved surface mapping area is doped with a lubricant.

In some embodiments of the present disclosure, a friction coefficient of a side surface of each thimble pin body of the first planar mapping area is smaller than a friction coefficient of a side surface of each thimble pin body of the curved surface mapping area.

In some embodiments of the present disclosure, each of the driving members includes a servo motor and a screw rod fixedly connected to the servo motor, one end of the screw rod distal from the servo motor is fixedly connected to a side of a corresponding bottom plate distal from the thimble pins.

In some embodiments of the present disclosure, the display panel includes a planar display area and a curved display area; the planar display area corresponds to the first planar mapping area, and the curved display area corresponds to the curved surface mapping area; a preset rising height of the planar display area of the display panel is H, a preset bending curvature radius of the curved display area of the display panel is R, a distance between the thimble pins of the curved surface mapping area is P, wherein $$P \leq \frac{\sqrt{2HR - H^2}}{2}.$$

The present disclosure provides a molding method for a curved display panel, including:

S10, providing a molding device for the curved display panel, wherein the molding device includes a mapping structure and a jacking mechanism; wherein the mapping structure includes a plurality of thimble pins movable in a vertical direction, the jacking mechanism includes a bottom plate assembly and a plurality of driving members; the bottom plate assembly includes a plurality of bottom plates, and any one of the bottom plates is independently driven by one of the driving members.

S20, attaching one end of the plurality of thimble pins of the mapping structure to the display panel, and attaching another end of the plurality of thimble pins of the mapping structure to the plurality of bottom plates.

S30, driving the plurality of driving members to move the thimble pins corresponding to the plurality of driving members in the vertical direction.

In some embodiments of the present disclosure, the plurality of driving members are driven simultaneously, moving speeds of the thimble pins corresponding to different driving members are different, and moving displacements of the thimble pins corresponding to different driving members are different.

In some embodiments of the present disclosure, the mapping structure includes a first planar mapping area, a second planar mapping area, and a curved surface mapping area disposed between the first planar mapping area and the second planar mapping area, the first planar mapping area corresponds to one of the bottom plates, and the curved surface mapping area corresponds to a plurality of the bottom plates; a moving speed of each of the thimble pins of the first planar mapping area is greater than a moving speed of each of the thimble pins of the curved surface mapping area, and a movement displacement of each of the thimble pins of the first planar mapping area is greater than a movement displacement of each of the thimble pins of the curved surface mapping area.

In some embodiments of the present disclosure, the curved surface mapping area includes a plurality of sub-curved surface mapping areas, each of the sub-curved surface mapping areas corresponds to one of the bottom plates; in a direction of the first planar mapping area pointing to the second planar mapping area, moving speeds of the thimble pins corresponding to the plurality of sub-curved surface mapping areas gradually decrease, and moving displacements of the thimble pins corresponding to the plurality of sub-curved surface mapping areas gradually decrease.

In some embodiments of the present disclosure, a portion of the display panel corresponding to the curved surface mapping area is stretched to form a curved surface.

Embodiments of the present disclosure also provide a curved display panel, and the curved display panel is prepared by the molding method in the above embodiments.

In some embodiments of the present disclosure, the curved display panel includes a planar display area and a curved display area disposed arranged the planar display area, and an outer contour of the curved display area is continuous.

In some embodiments of the present disclosure, a stretching rate of the planar display area is zero, and a stretching rate of the curved display area is greater than zero.

In some embodiments of the present disclosure, along a direction of the planar display area pointing to the curved display area, stretching rates of the curved display area gradually increase.

In some embodiments of the present disclosure, the curved surface display area includes four first curved surface display areas respectively disposed on four sides of the planar display area, and a gaussian area connecting two adjacent first curved surface display areas, and a stretching rate of the gaussian area is greater than a stretching rate of the first curved surface display areas.

Beneficial effects of the present disclosure are as follows: the molding device provided by embodiments of the present disclosure includes the mapping structure and the jacking mechanism, the mapping structure includes the plurality of thimble pins movable in the vertical direction, one end of each of the thimble pins is configured to be attached to the display panel, the jacking mechanism includes a bottom plate assembly and a plurality of driving members, the bottom plate assembly includes the plurality of bottom plates configured to be attached to another end of the corresponding thimble pins, and any one of the bottom plates is independently driven by one of the driving members. The plurality of bottom plates can separately drive the plurality of thimble pins under an action of corresponding driving members to independently control a moving displacement of the thimble pins corresponding to each of the bottom plates, thereby driving corresponding areas of the display panel to rise by different displacements, thereby accurately controlling a shape of the display panel during a molding process, reducing local stress concentration phenomena of the display panel during a stretching deformation process under external force, and achieving a better molding effect.

DESCRIPTION OF DRAWINGS

FIG. 10 is a schematic front diagram of a mapping structure after a display panel is molded provided by an embodiment of present disclosure.

FIG. 11 is a schematic diagram of a comparison of stretching deformation of a display panel before and after a soft cushion is doped with a lubricant provided by an embodiment of present disclosure.

FIG. 12 is a schematic diagram of a comparison of a stretching area of a display panel before and after a soft cushion is doped with a lubricant provided by an embodiment of present disclosure.

FIG. 13 is a flowchart of steps of a method for molding a curved display panel provided by an embodiment of present disclosure.

DETAILED DESCRIPTION OF PREFERRED EMBODIMENTS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

In the descriptions of the present disclosure, the terms "center", "length", "width", "upper", "lower", "vertical", "horizontal", "top", "bottom", and other indicated directions or the position relation are based on the orientation or position relation shown in the figures. Only for convenience of describing the present disclosure and the simplification of the description, rather than indicating or implying that the means or elements referred to have a specific orientation, so that the above directions of the present disclosure cannot be understood as limitations. In addition, the terms "first" and "second" are used only for purposes of description, and cannot be understood to indicate or imply a relative importance or to implicitly indicate the number of technical features indicated. Thus, the features "first" and "second" can be expressly or implicitly included in one or more of the features. In the description of the present disclosure, the meanings of "multiple" are two or more, unless specifically limited otherwise.

Figure 1:
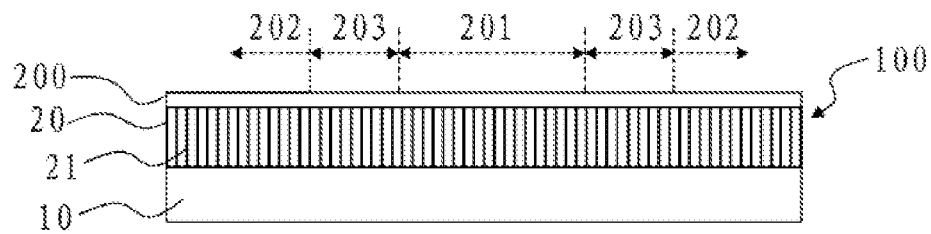
FIG. 1 is a schematic diagram of a molding device before a display panel is molded provided by an embodiment of present disclosure.
Figure 3:
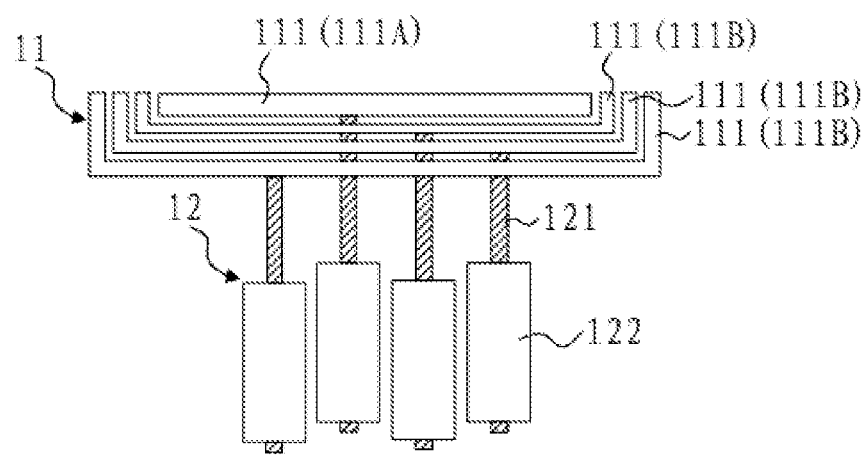
FIG. 3 is a schematic structural diagram of a jacking mechanism provided by an embodiment of present disclosure.

Please refer to FIG. 1 and FIG. 3, FIG. 1 is a schematic diagram of a molding device before a display panel is molded provided by an embodiment of present disclosure. FIG. 3 is a schematic structural diagram of a jacking mechanism provided by an embodiment of present disclosure. An embodiment of the present disclosure provides a molding device 100 for a curved display panel, including a mapping structure 20 and a jacking mechanism 10, the mapping structure 20 includes a plurality of thimble pins 21 movable in a vertical direction, one end of each of the thimble pins 21 is configured to be attached to a display panel 200, the jacking mechanism 10 includes a bottom plate assembly 11 and a plurality of driving members 12, the bottom plate assembly 11 includes a plurality of bottom plates 111, each of the bottom plates 111 are configured to be attached to another end of corresponding thimble pins 21, and any one of the bottom plates 111 is independently driven by one of the driving members 12.

Figure 2:
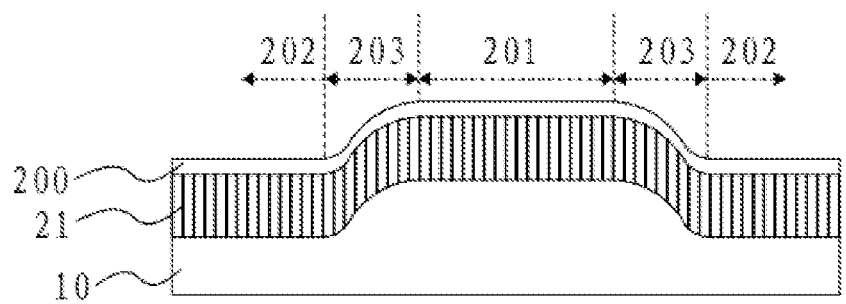
FIG. 2 is a schematic structural diagram of a molding device after a display panel is molded provided by an embodiment of present disclosure.

Please refer to FIG. 1 and FIG. 2, FIG. 2 is a schematic structural diagram of a molding device after a display panel is molded. In the molding device 100 provided by an embodiment of present disclosure, ends of the plurality of thimble pins 21 are attached to the display panel 200, and other ends of the plurality of thimble pins 21 are attached to the plurality of bottom plates 111, the display panel 200 includes a planar display area and a curved display area, the planar display area and the curved display area correspond to different bottom plates 111, the plurality of bottom plates 111 can separately drive the plurality of thimble pins 21 under an action of corresponding driving members 12, so that a movement displacement of the thimble pins 21 corresponding to each of the bottom plates 111 in the vertical direction can be independently controlled, thereby driving corresponding areas of the display panel 200 to rise by different displacements, thereby accurately controlling a shape of the display panel 200 during a molding process, reducing local stress concentration phenomena of the display panel 200 during a stretching deformation process under external force, and achieving a better molding effect. Compared with molding methods of the prior art such as hot-pressing molding, vacuum adsorption, etc., the molding device provided by an embodiment of present disclosure has a characteristic of point-to-point mapping molding, which can not only accurately control the molding process, but also realize the molding process of the curved display panel under a normal temperature and normal pressure.

Please refer to FIG. 3, each of the driving members 12 includes a servo motor 122 and a screw rod 121 fixedly connected to the servo motor 122, one end of the screw rod 121 distal from the servo motor 122 is fixedly connected to a side of a corresponding bottom plate 111 distal from the thimble pins 21.

Specifically, a rotation axis of the servo motor 122 and a center line of the screw rod 121 are on a same straight line, each of the driving members 12 further includes a servo driver, and the servo driver sends a pulse to control the servo motor 122 to rotate, the screw rod 121 includes a screw thread, which converts a rotary motion into a linear motion, and a jacking speed and a jacking height of each of the driving members 12 are adjusted by adjusting parameters such as a pulse of each of the driving members 12 and a pitch of the screw rod 121.

Figure 4:
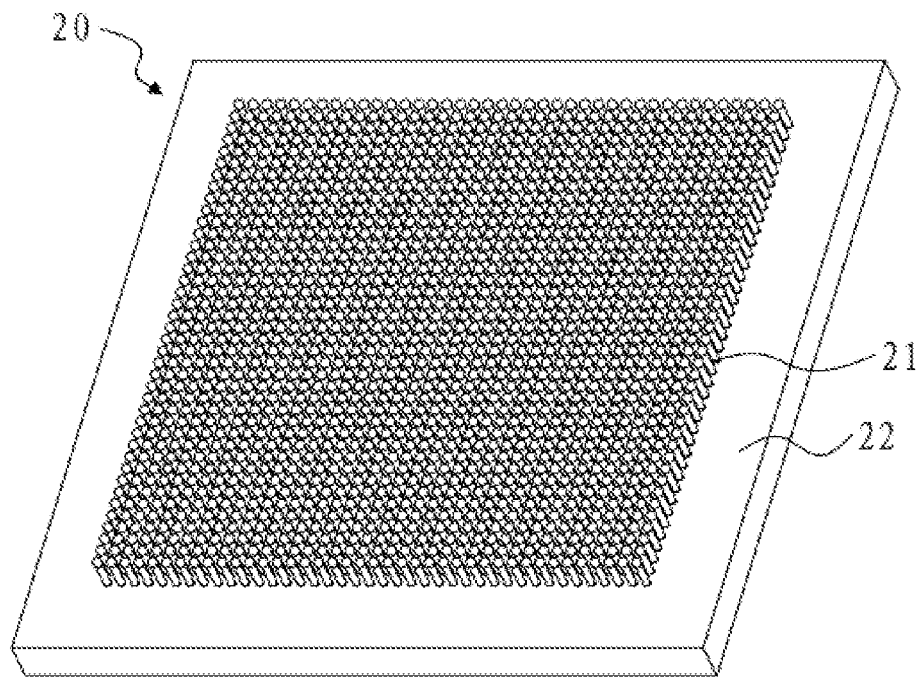
FIG. 4 is a schematic diagram of a front structure of a mapping structure provided by an embodiment of present disclosure.
Figure 5:
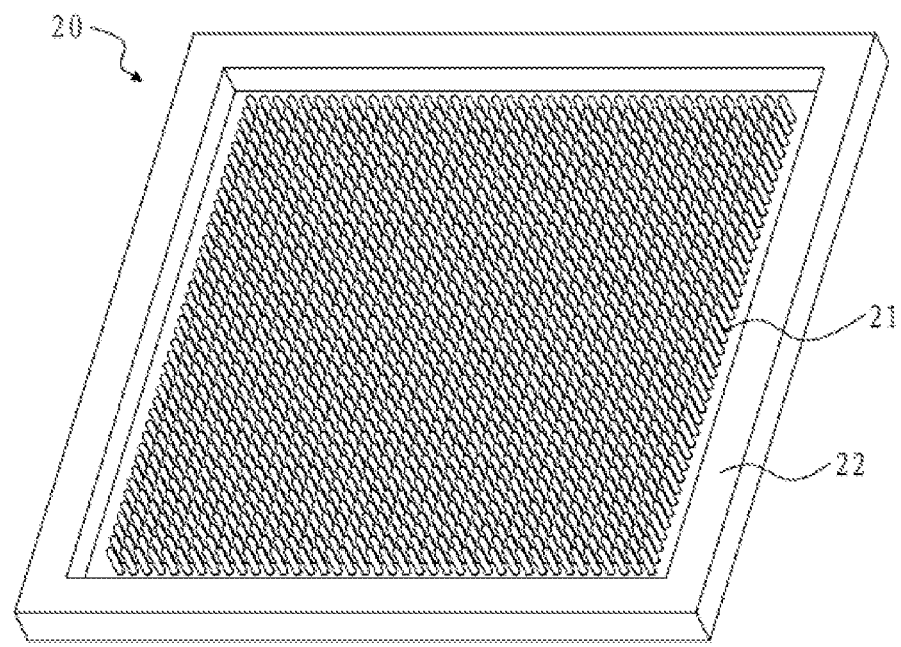
FIG. 5 is a schematic diagram of a reverse structure of a mapping structure provided by an embodiment of present disclosure.

Please refer to FIG. 4 and FIG. 5, FIG. 4 is a schematic diagram of a front structure of a mapping structure, FIG. 5 is a schematic diagram of a reverse structure of a mapping structure. The mapping structure 20 includes a base 22, and the base 22 includes a plurality of limiting holes (not shown in the drawings), the limiting holes are distributed in a middle portion of the base 22 in an array, the plurality of thimble pins 21 are disposed in the limiting holes in a one-to-one correspondence and extend out of the limiting holes. The limiting holes play a role of clamping to fix each of the thimble pins 21 to a set position. The limiting holes are configured to allow the thimble pins 21 to move in the vertical direction, but not to allow the thimble pins 21 to move in a horizontal direction.

It is understandable that when the mapping structure 20 is not used to stretch the display panel 200 into the curved display panel, the thimble pins 21 of the mapping structure 20 are in a reset state, the reset state refers to that ends of all the thimble pins 21 for attaching to the display panel 200 are flush with each other, and other ends of the thimble pins 21 for attaching to the bottom plates 111 are flush with each other.

Please refer to FIG. 1 and FIG. 2, the mapping structure 20 includes a first planar mapping area 201, a second planar mapping area 202, and a curved surface mapping area 203 disposed between the first planar mapping area 201 and the second planar mapping area 202, during the molding process, all the thimble pins 21 in the first planar mapping area 201 rise by a same displacement under an action of corresponding bottom plate 111, and all the thimble pins 21 in the second planar mapping area 202 rise by a same displacement under the action of corresponding bottom plate 111, the thimble pins 21 in the curved surface mapping area 203 rise by different displacements under the action of different bottom plates 111, that is, a surface formed by the ends of all the thimble pins 21 in the first planar mapping area 201 attached to the display panel 200 is flat, a portion of the display panel 200 corresponding to the first planar mapping area 201 is not stretched and deformed, a surface molded by the ends of all the thimble pins 21 in the second planar mapping area 201 attached to the display panel 200 is flat, a portion of the display panel 200 corresponding to the second planar mapping area 201 is not stretched and deformed, a surface formed by the ends of all the thimble pins 21 of the curved surface mapping area 203 attached to the display panel 200 is a curved surface, a portion of the display panel 200 corresponding to the curved surface mapping area 203 is stretched and deformed to form a curved surface.

Figure 6:
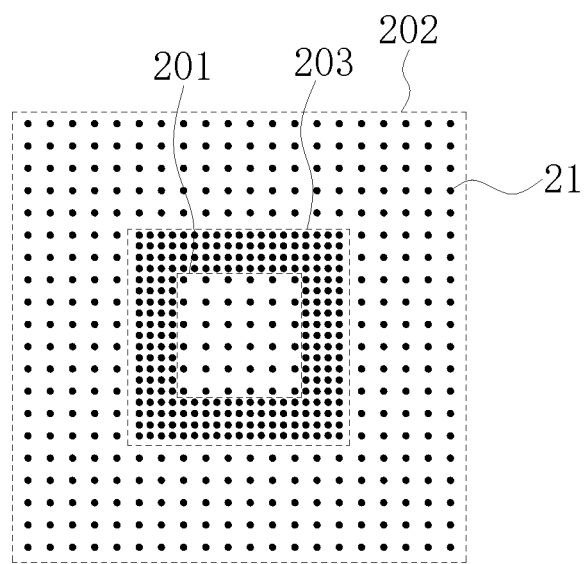
FIG. 6 is a schematic diagram of thimble pins distribution of a mapping structure provided by an embodiment of present disclosure.
Figure 7:
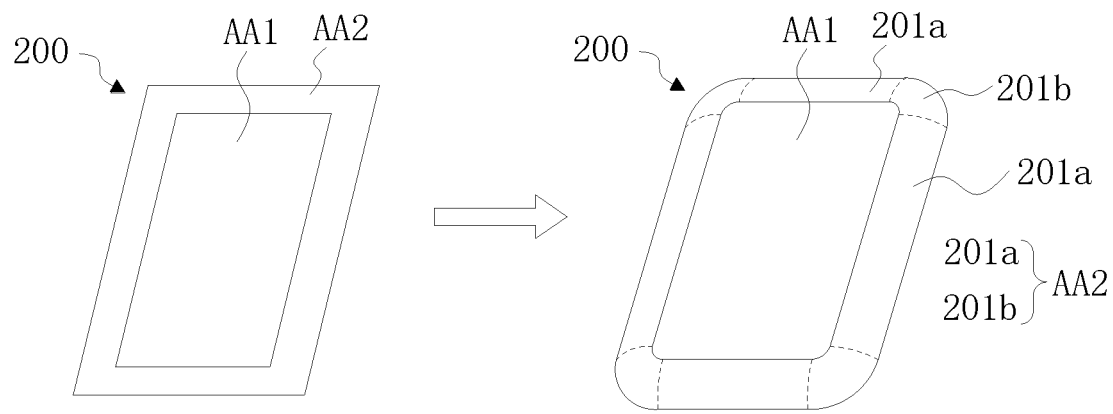
FIG. 7 is a schematic structural diagram of a display panel before and after being molded provided by an embodiment of present disclosure.

Please refer to FIG. 6 and FIG. 7, FIG. 6 is a schematic diagram of thimble pins distribution of a mapping structure, FIG. 7 is a schematic structural diagram of a display panel before and after being molded. The display panel 200 includes a planar display area AA1 and a curved display area AA2, the planar display area AA1 corresponds to the first planar mapping area 201, the planar display area AA1 of the display panel 200 after being molded is a planar display surface, the curved display area AA2 corresponds to the curved surface mapping area 203, the curved display area AA2 of the display panel 200 after being molded is a curved display surface. Since the thimble pins 21 of the first planar mapping area 201 rise by a same height and are at a same horizontal plane, the planar display area AA1 is not stretched and deformed. The thimble pins 21 in the first planar mapping area 201 and the second planar mapping area 202 do not need to accurately control a shape and an amount of stretching deformation of the display panel 200, so that a distribution density of the thimble pins 21 in the first planar mapping area 201 and the second planar mapping area 202 may be lower. Since the plurality of thimble pins 21 of the curved surface mapping area 203 rise by different heights and are at different horizontal planes, the curved display area AA2 is stretched and deformed under an action of the thimble pins 21 of the curved surface mapping area 203. The thimble pins 21 in the curved surface mapping area 203 need to accurately control the shape and the amount of stretching deformation of the display panel 200, so a distribution density of the thimble pins 21 in the curved surface mapping area 203 may be higher. In other words, a distance between the thimble pins 21 of the first planar mapping area 201 and a distance between the thimble pins 21 of the second planar mapping area 202 are greater than a distance between the thimble pins 21 of the curved surface mapping area 203. By a design of dividing the plurality of thimble pins 21 into areas with different density, a high-density design of thimble pins is not required to be adopted on a whole surface, which can effectively reduce complexity of the mapping structure 20, and reduce an action area of the jacking mechanism 10, which is conducive to improving operation convenience of the jacking mechanism 10.

Furthermore, FIG. 7 is a schematic structural diagram of a display panel after being molded provided by an embodiment of present disclosure. In some embodiments of the present disclosure, the display panel 200 after being molded is a display panel with four-curved surfaces, that is, a central area of the display panel 200 is the planar display area, and a surrounding area around the central area is the curved display area. Please refer to FIG. 6, correspondingly, in order to form the display panel with four-curved surfaces, the curved surface mapping area 203 surrounds the first planar mapping area 201, and the second planar mapping area 202 surrounds the curved surface mapping area 203.

Figure 8:
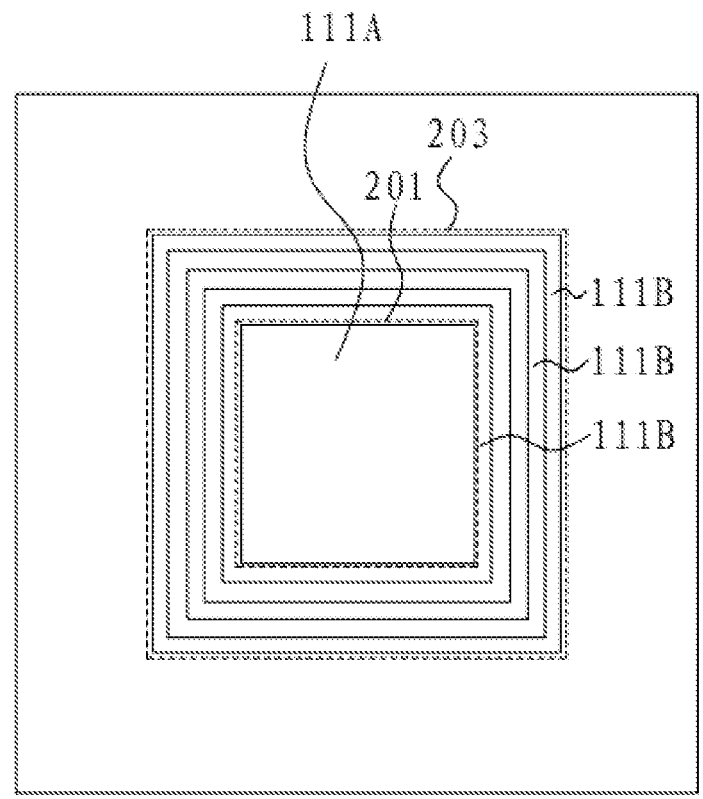
FIG. 8 is a schematic plan diagram of a bottom plate assembly provided by an embodiment of present disclosure.

Specifically, please refer to FIG. 3 and FIG. 8, FIG. 8 is a schematic plan diagram of a bottom plate assembly. The bottom plate assembly 11 includes a first bottom plate 111A and a plurality of second bottom plates 111B, the first bottom plate 111A is configured to be attached to a plurality of the thimble pins 21 of the first planar mapping area 201, the curved surface mapping area 203 includes a plurality of sub-curved surface mapping areas, each of the second bottom plates 111B are configured to be correspondingly attached to a plurality of the thimble pins 21 of one of the sub-curved surface mapping areas. In an embodiment of the present disclosure, since the thimble pins 21 of the second planar mapping area 202 do not need to be driven, there is no need to provide a bottom plate at a corresponding position of the second planar mapping area 202. It is understandable that, in other embodiments, if a portion of the display panel corresponding to the second planar mapping area 202 needs to be molded under actions of the thimble pins, a corresponding bottom plate needs to be disposed in the second planar mapping area 202 to drive the thimble pins at the corresponding position.

Figure 9:
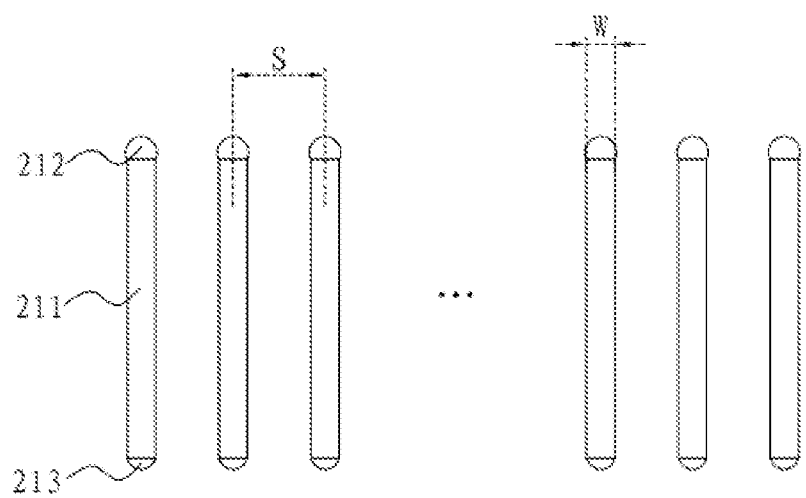
FIG. 9 is a schematic structural diagram of a thimble pin provided by an embodiment of present disclosure.

Furthermore, the plurality of sub-curved surface mapping areas of the curved surface mapping area 203 sequentially surround the first planar mapping area 201, correspondingly, the plurality of second bottom plates 111B sequentially surround the first bottom plate 111A, so as to realize that the thimble pins 21 of each of the sub-curved surface mapping areas are driven by one of the second bottom plates 111B. The plurality of second bottom plates 111B separately drive the plurality of thimble pins 21 of the curved surface mapping area 203 under actions of corresponding driving members 12, which can accurately control the shape of the display panel 200 during the molding process, effectively reduce the local stress concentration phenomena of the display panel 200 during the stretching deformation process, and achieve a good molding effect of four-curved surfaces.

please refer to FIG. 9, FIG. 9 is a schematic structural diagram of a thimble pin. Each of the thimble pins 21 provided by an embodiment of present disclosure includes a thimble pin body 211, a soft cushion 212 disposed at one end of the thimble pin body 211, and a lubricating layer 213 disposed at another end of the thimble pin body 211, the soft cushion 212 is configured to be attached to the display panel 200, and the lubricating layer 213 is configured to be attached to a corresponding bottom plate 111.

Since upper ends of the thimble pins 21 need to be attached to the display panel 200, in order to prevent the thimble pins 21 from damaging the display panel 200 during a jacking process, the soft cushion 212 is disposed at one end of the thimble pin body 211 to protect the display panel 200. Preferably, an elastic modulus of the soft cushion is 1 GPa to 1.4 GPa, and within a range of the elastic modulus, the display panel 200 can be effectively prevented from being damaged.

In some embodiments of the present disclosure, a material of the soft cushion 212 includes a silica gel, and one side surface of the soft cushion 212 attached to the display panel 200 may be a spherical surface.

Since lower ends of the thimble pins 21 need to be attached to the bottom plates 111, the thimble pins 21 move upwards in the vertical direction under a jacking action of the bottom plates 111. In order to avoid that a friction coefficient between the thimble pins 21 and the bottom plates 111 is too large, the lubricating layer 213 is disposed at another end of the thimble pin body 211 to play a role of lubrication and preventing wear. Preferably, a surface friction coefficient of the lubricating layer is 0.02 to 0.10, and within a range of the friction coefficient, wear between the thimble pins 21 and the bottom plates 111 can be effectively reduced.

In some embodiments of the present disclosure, a material of the lubricating layer 213 includes a fluorine resin with a lubricating effect, and the fluorine resin may be a Teflon material. The lubrication layer 213 may be formed by coating a layer of the Teflon material on a portion of the thimble pin body 211 that needs to be in contact with a corresponding bottom plate 111.

A whole of each of the thimble pins 21 may be cylindrical, specifically, the thimble pin body 211 may be cylindrical. In an embodiment of the present disclosure, a side surface of each thimble pin body 211 in the curved surface mapping area 203 is an uneven surface, so as to increase damping of a side surface of each thimble pin body 211 in the curved surface mapping area 203, so that the thimble pins 21 move upwards slowly, and adjacent thimble pins 21 cannot be driven by the display panel to move upwards, thereby increasing accuracy of a displacement of each of the thimble pins 21 at each point position corresponding to the curved surface mapping area 203, and further improving accuracy of stretching deformation of the display panel.

Since each of the thimble pins 21 in the first planar mapping area 201 is jacked with a same displacement, no stretching occurs, a side surface of each thimble pin body 211 of the first planar mapping area 201 does not need to be subjected to uneven surface treatment, and a friction coefficient of the side surface of each thimble pin body 211 of the first planar mapping area 201 is smaller than a friction coefficient of a side surface of each thimble pin body 211 of the curved surface mapping area 203.

In some embodiments of the present disclosure, a side surface of each thimble pin body 211 is frosted to increase surface roughness to form an uneven surface. The side surface of each thimble pin body 211 can also be coated with damping liquid to increase surface damping.

A material of the thimble pin body 211 includes a metal material such as stainless steel or a hard material.

In some embodiments of the present disclosure, a width of each of the thimble pins 21 in the first planar mapping area 201 and the second planar mapping area 202 is greater than or equal to a width of each of the thimble pins 21 in the curved surface mapping area 203. The width of each of the thimble pins 21 mentioned in the embodiment refers to a width of a cross section of the thimble pin body 211 of each of the thimble pins 21, and when the thimble pin body 211 is in a cylindrical shape, the width of each of the thimble pins 21 refers to a diameter of the thimble pin body 211.

The molding device 100 provided by an embodiment of present disclosure may be applied to molding of small-sized display panels (such as a mobile phone size), a distance S between center lines of adjacent thimble pins 21 is less than 1 mm, and a cylindrical diameter W of the thimble pin body 211 is less than or equal to 0.5 mm. In other embodiments, the molding device 100 may also be used for large-sized display panels (such as a television), and an actual size of each of the thimble pins 21 may be designed according to a size of a molded product and an area of a region required to be stretched.

please refer to FIG. 10, FIG. 10 is a schematic front diagram of a mapping structure after a display panel is molded. During the molding process, the first bottom plate 111A corresponding to the first planar mapping area 201, the second bottom plates 111B corresponding one-to-one to the plurality of sub-curved surface mapping areas move vertically upward under an action of respectively corresponding driving members 12, the plurality of thimble pins 21 are jacked under an action of different bottom plates 111, and different degrees of displacements are generated in the vertical direction, the display panel 200 is then lifted upward by the thimble pins 21, and at this time, the portion of the display panel 200 corresponding to the first planar mapping area 201 is jacked by a same bottom plate 111, so that stretching deformation is not generated, the portion of the display panel corresponding to the curved surface mapping area 203 is jacked at different speeds or displacements by different bottom plates 111, local stretching deformation is generated, and the stretching deformation is increased along with an increasing amount of upward displacement of the thimble pins 21, until a deformation shape of a stretching area of the display panel reaches a preset shape, thereby completing molding of the display panel 200. The display panel after being molded has a same shape as a surface formed by ends of the plurality of thimble pins 21 of the first planar mapping area 201 and the curved surface mapping area 203. The molding method does not require hot pressing and vacuum adsorption, the display panel 200 can be molded under a normal temperature and normal pressure, and the molding process is controllable, and damage to the display panel 200 can also be avoided.

Furthermore, in some embodiments of the present disclosure, the soft cushion 212 of each of the thimble pins 21 in the curved surface mapping area 203 is doped with a lubricant to reduce surface energy of the soft cushion 212 in the curved surface mapping area 203, so that when the soft cushion 212 in the curved surface mapping area 203 is in contact with and attached to the display panel 200, and the portion of the display panel 200 corresponding to the curved surface mapping area 203 is stretched, the display panel 200 slides left and right relative to the thimble pins 21, stretching deformation transitions to both sides, thereby effectively reducing local stress concentration of the display panel 200 during the stretching deformation process.

Specifically, the display panel 200 is attached to the thimble pins 21 through an adhesive layer (not shown in the drawings). By performing surface energy reduction treatment on each soft cushion 212 of the curved surface mapping area 203, surface energy is low enough to prevent the soft cushion 212 from bonding with the adhesive layer, the portion of the display panel 200 corresponding to the first planar mapping area 201 is not stretched and deformed, so that the soft cushion 212 of each of the thimble pins 21 of the first planar mapping area 201 does not need to be subjected to surface energy reduction treatment, the soft cushion 212 of each of the thimble pins 21 of the first planar mapping area 201 is bonded to the adhesive layer to achieve a fixing effect, thereby avoiding displacements of the display panel 200 during the molding process. The surface energy mentioned in the embodiment of the present disclosure is defined as excess energy of a material surface relative to an interior of the material, the lower surface energy of an adherend, the worse wettability, and the worse bonding effect.

The lubricant includes a fluorine resin. Specifically, the soft cushion 212 may be pre-placed in an organic solvent (alcohol, xylene, etc.) for swelling, and then placed in a fluorine resin solution, so that the fluorine resin intrudes into tissue of the soft cushion, and after a solvent is volatilized, the fluorine resin is enclosed in the soft cushion, so that the soft cushion after being treated has characteristics that lubricating coating is not prone to fall off, and has lasting lubricity, low surface energy, and cannot be bonded with the adhesive layer such as OCA. In other embodiments, a layer of fluorine resin solution may also be directly coated on a surface of the soft cushion, but it is used after a period of time, a coating is likely to fall off, and lubricity is reduced. The fluorine resin may specifically be Teflon, surface tension of the Teflon is only 0.019 N/m, surface energy is small, and adhesion performance with the adhesive layer such as OCA is poor. A size of a surface energy design of the soft cushion is determined depending on types of lubricant such as fluororesin and a type of adhesive layer.

In the molding process of the display panel, the display panel corresponding to the curved surface mapping area 203 is partially stretched, the plurality of thimble pins 21 of the curved surface mapping area 203 have different degrees of displacements, and the stretching deformation of the display panel increases alone with an increasing amount of upward displacements of the thimble pins. Since an upper end of each of the thimble pins of the curved surface mapping area 203 of an embodiment has a soft cushion 212 with low surface energy, the soft cushion 212 is not bonded to the adhesive layer, the display panel can slide slightly along a plane direction, so that the stretching deformation of the display panel 200 corresponding to the curved surface mapping area 203 transitions to both sides, and such transition can effectively reduce the local stress concentration of the display panel in a whole stretching deformation process.

Please refer to FIG. 11, FIG. 11 is a schematic diagram of a comparison of stretching deformation of a display panel before and after a soft cushion is doped with a lubricant, as shown in a and b of FIG. 11, since no lubricant is added, the soft cushion 212 is bonded and fixed to the display panel 200 by the adhesive layer, sliding between the thimble pins 21 and the display panel 200 does not occur, at this time, an area involving in stretching deformation of the display panel is an area corresponding to a curved profile surface 113, and a cross-sectional perimeter of the display panel involving in stretching deformation is stretched from L1 to L1'. As shown in c and d of FIG. 11, the soft cushion 212 of each of the thimble pins 21 corresponding to the curved surface mapping area 203 is doped with the lubricant, the surface energy of the soft cushion is reduced, and a portion of display panel corresponding to the thimble pins 21 can slide horizontally, at this time, the area involving in stretching deformation of the display panel can be expanded on a basis of an area corresponding to the curved surface mapping area 203 (changed from L1 to L2), and a cross-sectional perimeter of the display panel involving in stretching deformation is stretched from L2 to L2', since jacking heights of the bottom plates 111 corresponding to the curved surface mapping area 203 of two stretching methods are same, shapes of the display panel after being stretched and deformed of two methods are same, therefore, $\Delta L = L1' - L1 = L2' - L2$.

Please refer to FIG. 12, a of FIG. 12 is a schematic diagram of a stretching area of a display panel when a lubricant is not added, b of FIG. 12 is a schematic diagram of a stretching area of a display panel when a soft cushion of each of the thimble pins of the curved surface mapping area 203 is doped with a lubricant. By adopting the thimble pins 21 doped with the lubricant, an original area of the area involving in stretching deformation of the display panel is increased from S1 to S2, and an actual deformation area after being stretched is $\Delta S = \Delta L \times C$, wherein C is a perimeter of a junction where curvature of a curved edge portion of the display panel changes suddenly, since jacking heights of the bottom plates corresponding to the curved mapping surface area 203 are not changed, so that C is a constant. A stretching rate of the display panel is $\Delta S/S$, and $\Delta S/S = (\Delta L \times C)/S$, therefore, the stretching rate of the display panel is related to an area of the area involving in stretching deformation, the larger the area of the area involving in stretching deformation, the smaller the stretching rate of the display panel. With a design of the soft cushion of each of the thimble pins doped with the lubricant, the display panel has a larger area to participate in stretching, the smaller the stretching rate of the display panel in a stretching process, the more easily an effect of curved surface attaching is achieved and a success rate of bending molding is improved.

In an embodiment of the present disclosure, the display panel 200 is a stretchable display panel, including any one of an OLED display panel and a micro LED display panel.

The display panel 200 is a stretchable display panel, which can be stretched and deformed under an action of external force. In some embodiments of the present disclosure, the display panel 200 includes a stretchable island bridge structure, including a plurality of pixel islands and connecting bridges connecting two adjacent pixel islands, each of the pixel islands includes a pixel driving circuit and a pixel light emitting unit electrically connected to the pixel driving circuit, and each of the connecting bridges includes a plurality of wires electrically connected to the pixel driving circuits of two adjacent pixel islands. A shape of the connecting bridge includes a serpentine shape or an S shape, the pixel islands may be rigid islands, when the display panel 200 is stretched and deformed, the connecting bridges participate in stretching, and the pixel islands do not stretch, so that devices on the pixel islands are protected from being affected.

The display panel 200 may further include a first flexible supporting layer disposed on one side of the pixel islands and the connecting bridges, and a second flexible supporting layer disposed on other side of the pixel islands and the connecting bridges, the first flexible supporting layer and the second flexible supporting layer play a role in supporting and protecting, thereby preventing the pixel islands and the connecting bridges from being twisted and deformed during the stretching process of the display panel 200. A material of the first flexible support layer and the second flexible support layer includes a polydimethylsiloxane (PDMS) substrate with excellent elasticity.

Compared with conventional display panels, the display panel 200 with stretchable performance described above can be locally stretched and deformed under an action of external force when 3D attaching is performed to realize four-curved surfaces display, there are no redundant parts in four corners, and no wrinkles occur. Under an action of the molding device 100 provided by an embodiment of the present disclosure, the display panel 200 with the stretchable performance described above can be stretched from a planar state to a required specific four-curved surface state, and the molding method of the molding device 100 provided by an embodiment of the present disclosure can be performed under a normal temperature, and at the same time, can ensure that an overall stretching deformation process of the display panel 200 is controllable.

Figure 14:
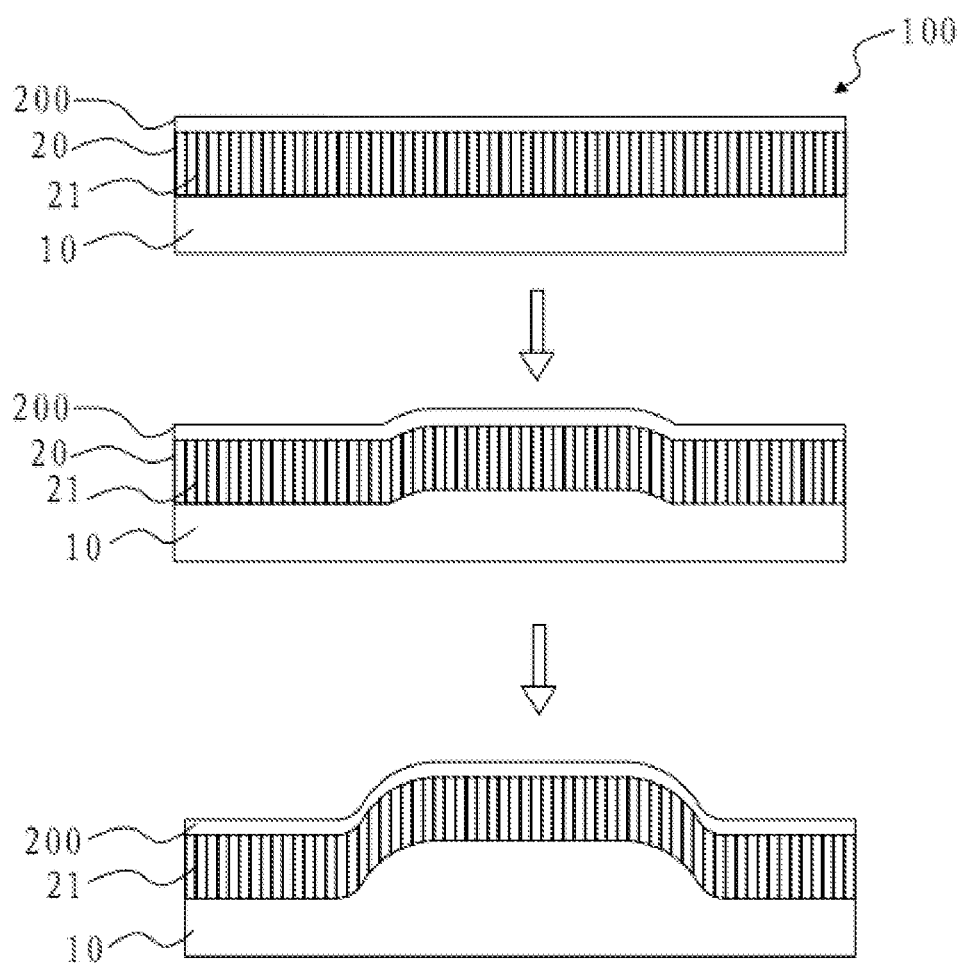
FIG. 14 is a schematic structural diagram of a molding process of a curved display panel provided by an embodiment of present disclosure.

Please refer to FIG. 3, FIG. 13, and FIG. 14, based on the molding device for the curved display panel described above, an embodiment of the present disclosure further provides a molding method for a curved display panel, including the following steps: S10, providing a molding device 100 for the curved display panel, wherein the molding device 100 includes a mapping structure 20 and a jacking mechanism 10, wherein the mapping structure 20 includes a plurality of thimble pins 21 movable in a vertical direction, the jacking mechanism 10 includes a bottom plate assembly 11 and a plurality of driving members 12, the bottom plate assembly 11 includes a plurality of bottom plates 111, and any one of the bottom plates 111 is independently driven by one of the driving members 12. S20, attaching one end of the plurality of thimble pins 21 of the mapping structure 20 to the display panel 200, and attaching another end of the plurality of thimble pins 21 of the mapping structure 20 to the plurality of bottom plates 111. S30, driving the plurality of driving members 12 to move the thimble pins 21 corresponding to the plurality of driving members 12 in the vertical direction.

A specific structure of the molding device 100 can be referred to embodiments described above, and details are not described again.

One side of the display panel 200 is pre-attached with an adhesive layer, and then the adhesive layer is attached to an end of the plurality of thimble pins 21 to fix the display panel 200 and the thimble pins 21, so that shapes of thimble pins 21 can be mapped on the display panel point-to-point during a subsequent molding process.

In the S20, ends of the plurality of thimble pins 21 attached to the display panel are flush with each other, and other ends of the plurality of thimble pins 21 attached to the plurality of bottom plates 111 are flush with each other, that is, top surfaces of the plurality of bottom plates 111 (one side surface attached to the thimble pins 21) are flush with each other.

In some embodiments of the present disclosure, the plurality of driving members 12 may be driven at the same time, different driving members 12 drive the corresponding bottom plates 111 at different driving speeds, so that moving speeds of the thimble pins 21 corresponding to different driving members 12 are different, movement displacements of the thimble pins 21 corresponding to different driving members 12 are different, so that different positions of the display panel 200 are promoted to rise by different displacements to form a preset curved surface shape.

Specifically, a moving speed of the thimble pins 21 of the first planar mapping area 201 is greater than a moving speed of the thimble pins 21 of the curved surface mapping area 203, and a movement displacement of the thimble pins 21 of the first planar mapping area 201 is greater than a movement displacement of the thimble pins 21 of the curved surface mapping area 203.

Furthermore, in a direction of the first planar mapping area 201 pointing to the second planar mapping area 202, moving speeds of the thimble pins 21 corresponding to the plurality of sub-curved surface mapping areas gradually decrease, and moving displacements of the thimble pins 21 corresponding to the plurality of sub-curved surface mapping areas gradually decrease, thus, the display panel having four-curved surfaces with a plane in a middle and a curved surface around is formed.

In an embodiment of the present disclosure, the thimble pins 21 of the first planar mapping area 201 and the curved surface mapping area 203 respectively correspond to a bottom plate 111 to be driven to jack upward. A number of turns of the thimble pins 21 corresponding to each of bottom plates 111 may be different, the larger a number of bottom plates 111 corresponding to the curved surface mapping area 203, the more precise a shape control of the curved surface molding is. The number of turns of the thimble pins 21 corresponding to a specific bottom plate 111 depends on a size of an actual display panel and production cost.

During a molding process, a portion of the display panel 200 corresponding to the first planar mapping area 201 is not stretched, a portion of the display panel corresponding to the curved surface mapping area is stretched to form a curved surface.

Figure 15:
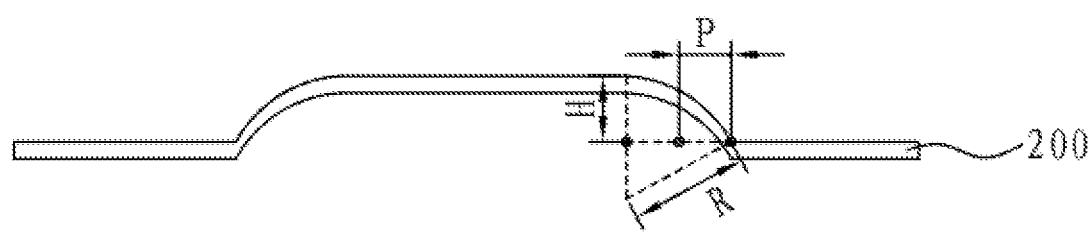
FIG. 15 is a schematic structural diagram of a curved display panel provided by an embodiment of present disclosure.

Please refer to FIG. 15, in an embodiment of the present disclosure, at least three thimble pins 21 are disposed in the curved surface mapping area 203, and ends of the thimble pins 21 of the curved surface mapping area 203 attached to the display panel 200 are jacked to form at least one circular arc surface. A preset rising height of a portion of the display panel 200 corresponding to the first planar mapping area 201 (that is, a portion of the planar display area AA1) is H, a preset bending curvature radius of a portion of the display panel 200 corresponding to the curved surface mapping area 203 (that is, a portion of the curved surface display area AA2) is R, a distance between the thimble pins of the curved surface mapping area 203 is P, wherein, $(2P)^2 \leq R^2 - (R-H)^2$, that is, $$P \leq \frac{\sqrt{2HR - H^2}}{2}.$$

Based on applications of the molding method and the molding device mentioned above, an embodiment of the present disclosure further provides a curved display panel, which is prepared by the molding method. Please refer to FIG. 7, the curved display panel 200 includes a planar display area AA1 and a curved display area AA2, the curved display area AA2 surrounds the flat display area AA1, the flat display area AA1 corresponds to the first flat mapping area 201, and the curved display area AA2 corresponds to the curved surface mapping area 203. The curved display panel 200 may be a stretchable display panel. For description of the stretchable display panel, refer to previous description.

Figure 16:
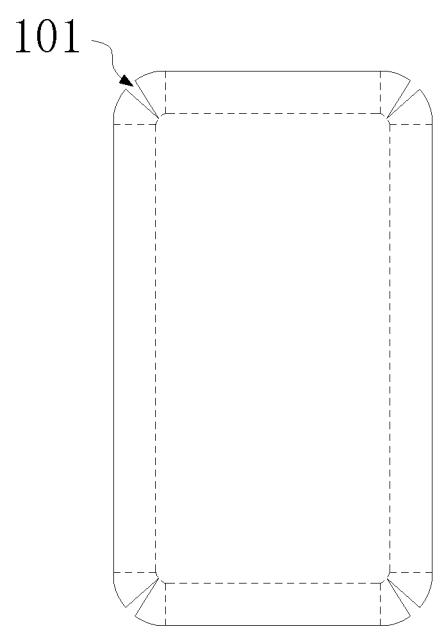
FIG. 16 is a schematic structural diagram of a curved display panel in a flat state in the prior art.

Please refer to FIG. 7, in an embodiment of the present disclosure, an outer contour of the curved display area AA2 of the display panel 200 is continuous, the embodiment of the present disclosure does not need to perform special-shaped cutting on corners of the curved display panel 200 to form a four-curved surfaces shape. In the prior art, as shown in FIG. 16, FIG. 16 is a schematic structural diagram of a curved display panel in a flat state in the prior art, usually, in order to prevent the display panel from wrinkles at corners during a curved surface forming process, a special-shaped cutting is performed on the corners of the display panel to form notches 101. An outer contour of the curved display area of existing display panels is discontinuous, and there are notches in a design.

Further, since the planar display area AA1 is jacked to a same height at every position, the planar display area AA1 is not stretched, and a stretching rate of the planar display area AA1 is zero. Since a display surface of the curved surface display area AA2 is a curved surface, and different positions are jacked to different heights, the curved surface display area AA2 is stretched, and a stretching rate of the curved surface display area AA2 is greater than zero.

When the curved display panel 200 is placed on a horizontal plane, (that is, the horizontal plane is parallel to a plane where the planar display area AA1 is located), a unit area of the horizontal plane is S0, and an actual area of the curved display panel 200 facing a region in the unit area of the horizontal plane is SA, and the stretch rate of the curved display panel 200 with a curved shape may be defined as a ratio of (SA-S0) to S0. For a measurement of the actual area of the curved display panel 200 facing the region in the unit area, a 3D measurement instrument may be utilized for scanning and calculation, the greater a stretch rate of a certain area of the curved display panel 200, the greater a corresponding curvature, and the greater a corresponding stretch degree.

In an embodiment of the present disclosure, please refer to FIG. 7, in the curved display panel 200, along a direction of the planar display area AA1 pointing to the curved display area AA2, stretching rates of the curved display area AA2 are gradually increased, and stretching degrees are gradually increased.

Specifically, the curved display panel 200 may be the display panel with four-curved surfaces, the curved surface display area AA2 includes four first curved surface display areas 201a respectively arranged on four sides of the planar display area AA1, and a gaussian area 201b connecting two adjacent first curved surface display areas 201a, and a stretching rate of the gaussian area 201b is greater than a stretching rate of the first curved surface display areas 201a.

Compared with the prior art in FIG. 16, there is no need to perform special-shaped cutting in the gaussian area 201b of an embodiment of the present disclosure, and there is no seam between two adjacent first curved surface display areas 201a. However, in the prior art, the curved display panel needs to be special-shaped cut at corners, notches 101 are formed, resulting in splicing seams in the curved display area.

The first curved surface display areas 201a corresponding to each side of the planar display area AA1 are stretched in a direction perpendicular to the side, that is, the first curved surface display areas 201a are stretched only in one direction. The gaussian area 201b is arranged at corners of the curved display panel 200 and is adjacent to the first curved surface display areas 201a in two different stretching directions, so that the gaussian area 201b can be stretched in two directions, so that a stretching degree of the gaussian area 201b is greater than a stretching degree of the first curved surface display areas 201a.

In summary, embodiments of the present disclosure provide the molding device for the curved display panel, the molding method thereof, and the curved display panel, the molding device 100 includes the mapping structure 20 and the jacking mechanism 10, the mapping structure 20 includes the plurality of thimble pins 21 movable in the vertical direction, one end of each of the thimble pins 21 is configured to be attached to the display panel 200, the jacking mechanism 10 includes the bottom plate assembly 11 and the plurality of driving members 12, the bottom plate assembly 11 includes a plurality of bottom plates 111 configured to be attached to another end of corresponding thimble pins 21, and any one of the bottom plates is independently driven by one of the driving members 12 in the vertical direction, the plurality of bottom plates 111 can separately drive the plurality of thimble pins 21 under an action of corresponding driving members 12 to independently control a moving displacement of the thimble pins 21 corresponding to each of the bottom plates 111, thereby driving corresponding areas of the display panel 200 to rise by different displacements, thereby accurately controlling a shape of the display panel 200 during a molding process, reducing local stress concentration phenomena of the display panel 200 during a stretching deformation process under external force, and achieving a better molding effect.

In the above embodiments, the description of each embodiment has its own emphasis, for a part that is not detailed in an embodiment, you can refer to the related descriptions of other embodiments.

The molding device for the curved display panel, the molding method thereof, and the curved display panel provided by the embodiments of the present disclosure are described in detail above, specific examples are used to explain the principle and implementation of the present disclosure, the descriptions of the above embodiments are only used to help understand the present disclosure technical solutions and their core ideas. Those of ordinary skill in the art should understand that they can still modify the technical solutions described in the foregoing embodiments, or equivalently replace some of the technical features. These modifications or replacements, and the essence of the corresponding technical solutions does not deviate from the scope of the technical solutions of the embodiments of the present application.

What is claimed is:

1. A molding device for a curved display panel, comprising:
    a mapping structure, wherein the mapping structure comprises a plurality of thimble pins movable in a vertical direction, one end of each thimble pin of the plurality of thimble pins is configured to be attached to a display panel; and
    a jacking mechanism, wherein the jacking mechanism comprises a bottom plate assembly and a plurality of driving members;
    wherein the bottom plate assembly comprises a plurality of bottom plates, the display panel comprises a planar display area and a curved display area, the planar display area and the curved display area correspond to different bottom plates, each bottom plate of the plurality of bottom plates are configured to be attached to another end of corresponding thimble pins, and any one of the bottom plates is independently driven by one of the plurality of driving members;
    wherein the mapping structure comprises a first planar mapping area, a second planar mapping area, and a curved surface mapping area disposed between the first planar mapping area and the second planar mapping area; a distance between the thimble pins of the first planar mapping area and a distance between the thimble pins of the second planar mapping area are greater than a distance between the thimble pins of the curved surface mapping area;
    wherein each of the thimble pins comprises a thimble pin body, a soft cushion disposed at one end of the thimble pin body, and a lubricating layer disposed at another end of the thimble pin body; the soft cushion is configured to be attached to the display panel, and the lubricating layer is configured to be attached to a corresponding bottom plate;
    wherein surface energy of the soft cushion of each of the thimble pins of the curved surface mapping area is smaller than surface energy of the soft cushion of each of the thimble pins of the first planar mapping area.

2. The molding device for the curved display panel of claim 1, wherein the bottom plate assembly comprises a first bottom plate and a plurality of second bottom plates, the first bottom plate is configured to be attached to a plurality of the thimble pins of the first planar mapping area; the curved surface mapping area comprises a plurality of sub-curved surface mapping areas, each second bottom plate of the plurality of second bottom plates is configured to be correspondingly attached to a plurality of the thimble pins of one of the sub-curved surface mapping areas.

3. The molding device for the curved display panel of claim 2, wherein the plurality of sub-curved surface mapping areas of the curved surface mapping area sequentially surround the first planar mapping area, and the plurality of second bottom plates sequentially surround the first bottom plate.

4. The molding device for the curved display panel of claim 1, wherein an elastic modulus of the soft cushion is 1 GPa to 1.4 GPa, a surface friction coefficient of the lubricating layer is 0.02 to 0.10.

5. The molding device for the curved display panel of claim 1, wherein the mapping structure is attached to the display panel through an adhesive layer; the soft cushion of each of the thimble pins of the curved surface mapping area is not attached to the adhesive layer, and the soft cushion of each of the thimble pins of the first planar mapping area is attached to the adhesive layer.

6. The molding device for the curved display panel of claim 5, wherein the soft cushion of each of the thimble pins of the curved surface mapping area is doped with a lubricant.

7. A molding device for a curved display panel, comprising:
- a mapping structure, wherein the mapping structure comprises a plurality of thimble pins movable in a vertical direction, one end of each thimble pin of the plurality of thimble pins is configured to be attached to a display panel; and
- a jacking mechanism, wherein the jacking mechanism comprises a bottom plate assembly and a plurality of driving members;
- wherein the bottom plate assembly comprises a plurality of bottom plates, the display panel comprises a planar display area and a curved display area, the planar display area and the curved display area correspond to different bottom plates, each bottom plate of the plurality of bottom plates are configured to be attached to another end of corresponding thimble pins, and any one of the bottom plates is independently driven by one of the plurality of driving members;
- wherein the mapping structure comprises a first planar mapping area, a second planar mapping area, and a curved surface mapping area disposed between the first planar mapping area and the second planar mapping area; a distance between the thimble pins of the first planar mapping area and a distance between the thimble pins of the second planar mapping area are greater than a distance between the thimble pins of the curved surface mapping area;
- wherein each of the thimble pins comprises a thimble pin body, a soft cushion disposed at one end of the thimble pin body, and a lubricating layer disposed at another end of the thimble pin body; the soft cushion is configured to be attached to the display panel, and the lubricating layer is configured to be attached to a corresponding bottom plate;
- wherein a friction coefficient of a side surface of each thimble pin body of the first planar mapping area is smaller than a friction coefficient of a side surface of each thimble pin body of the curved surface mapping area.

8. A molding device for a curved display panel, comprising:
- a mapping structure, wherein the mapping structure comprises a plurality of thimble pins movable in a vertical direction, one end of each thimble pin of the plurality of thimble pins is configured to be attached to a display panel; and
- a jacking mechanism, wherein the jacking mechanism comprises a bottom plate assembly and a plurality of driving members;
- wherein the bottom plate assembly comprises a plurality of bottom plates, the display panel comprises a planar display area and a curved display area, the planar display area and the curved display area correspond to different bottom plates, each bottom plate of the plurality of bottom plates are configured to be attached to another end of corresponding thimble pins, and any one of the bottom plates is independently driven by one of the plurality of driving members;
- wherein the mapping structure comprises a first planar mapping area, a second planar mapping area, and a curved surface mapping area disposed between the first planar mapping area and the second planar mapping area; a distance between the thimble pins of the first planar mapping area and a distance between the thimble pins of the second planar mapping area are greater than a distance between the thimble pins of the curved surface mapping area;
- wherein the planar display area corresponds to the first planar mapping area, and the curved display area corresponds to the curved surface mapping area; a preset rising height of the planar display area of the display panel is H, a preset bending curvature radius of the curved display area of the display panel is R, a distance between the thimble pins of the curved surface mapping area is P, wherein $$P \leq \frac{\sqrt{2HR - H^2}}{2}.$$

9. The molding device for the curved display panel of claim 1, wherein each driving member of the plurality of driving members comprises a servo motor and a screw rod fixedly connected to the servo motor, one end of the screw rod distal from the servo motor is fixedly connected to a side of a corresponding bottom plate distal from the thimble pins.

* * * * *